United States Patent
Kulkarni et al.

(10) Patent No.: US 8,614,143 B2
(45) Date of Patent: Dec. 24, 2013

(54) SIMULTANEOUS VIA AND TRENCH PATTERNING USING DIFFERENT ETCH RATES

(75) Inventors: Makarand R. Kulkarni, Richardson, TX (US); Deepak A. Ramappa, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 12/327,336

(22) Filed: Dec. 3, 2008

(65) Prior Publication Data

US 2010/0136781 A1    Jun. 3, 2010

(51) Int. Cl.
*H01L 21/4763*    (2006.01)

(52) U.S. Cl.
USPC ............... 438/622; 438/618; 257/E21.233; 216/39

(58) Field of Classification Search
USPC ........ 438/622, 700; 257/48, E21.233; 216/39
See application file for complete search history.

(56) References Cited

U.S. PATENT DOCUMENTS

| | | | |
|---|---|---|---|
| 2005/0191852 A1* | 9/2005 | Takigawa et al. | 438/637 |
| 2007/0155170 A1* | 7/2007 | Jang | 438/637 |
| 2008/0099870 A1* | 5/2008 | Wilson et al. | 257/446 |

OTHER PUBLICATIONS

Wolf et al. (Silicon Processing for the VLSI Era: vol. 1—Process Technology, 2nd Ed., Lattice Press, Sunset Beach, 2000, pp. 684, 685).*

* cited by examiner

*Primary Examiner* — Julio J Maldonado
*Assistant Examiner* — Robert Bachner
(74) *Attorney, Agent, or Firm* — Warren L. Franz; Wade J. Brady, III; Frederick J. Telecky, Jr.

(57) ABSTRACT

One embodiment of the present invention relates to a photolithography mask configured to form a metallization and via level utilizing a single lithography and etch process. More particularly, a photolithography mask comprising a mask via shape and one or more metal wire shapes is configured to produce both on-wafer metal lines and via levels. The mask via shape corresponds to an on-wafer photoresist via opening having a first critical dimension (CD). The one or more mask wire shapes correspond to one or more on-wafer photoresist wire openings respectively having a second CD. The first CD is larger than the second CD thereby providing a greater vertical etch rate for ILD exposed by the photoresist via opening than for ILD exposed by the one or more photoresist wire openings. This difference in CD results in a via extending vertically below the metal wire level, thereby making physical contact with underlying metal.

10 Claims, 10 Drawing Sheets

SIMULTANEOUS VIA AND TRENCH PATTERNING USING DIFFERENT ETCH RATES

FIELD OF INVENTION

The present invention relates generally to semiconductor device fabrication; and, more particularly, to the simultaneous formation of metal and via levels in back end of the line (BEOL) processing in the manufacture of integrated circuit chips or the like ("integrated chips").

BACKGROUND OF THE INVENTION

Modern day integrated chips are comprised of a very large number of semiconductor devices having microscopic dimensions. Operation of the semiconductor devices comprised within an integrated chip depend upon a robust system of electrical connections between the semiconductor devices and the outside world. These electrical connections are formed by a complex configuration of metal interconnect levels (i.e., metal levels; metal wire levels) that electrically interconnect various semiconductor devices of an integrated chip to each other and to an external power supply.

FIG. 1 shows an integrated chip's metal interconnect levels commonly referred to as a back end of the line (BEOL) metallization stack 100. The metallization stack comprises a vertical hierarchy of alternating metal levels (M1, M2, M3, M4) and via (i.e., stud) levels (V1, V2, V3) comprised within an inter-level dielectric material 102 having a low dielectric constant. The metal levels (M1, M2, M3, M4) provide horizontal interconnections between semiconductor devices 104, while the vias (V1, V2, V3) provide vertical interconnections between various layers of the horizontal metal levels (e.g., V1 provides an interconnection between M1 and M2). The inter-level dielectric material 102 is comprised of a plurality of dielectric layers (108, 110, 112, 114, 116) that provide physical support, electrical insulation, and electrical isolation between the metal and via levels.

The alternating metal and via levels typically increase in minimum horizontal dimension (e.g., metal line thickness) and vertical dimension (e.g., metal line height) as they appear vertically higher in the stack (e.g., thinner metal wire M1 is located below thicker metal wires M3 and M4). For example, as shown in FIG. 1, thin metal level M1 is connected to respective semiconductor devices 104 by way of a conductive contact 106. Thin metal level M1 is also connected by via V1 to thicker metal level M2 located vertically above the thin metal level M1. The thickest metal levels are typically coupled to a wirebond or flip-chip packaging through which electrical impulses can be transmitted to semiconductor devices of the integrated chip. In general, thin metal levels (i.e., metal wires having a relatively small critical dimension with respect to other metals in the same stack) are configured to carry small currents and to connect to thicker metal levels configured to carry larger currents. This hierarchy allows thick metal levels to carry power to a large number of semiconductor devices via the thin metal levels.

Metal wire levels and via levels are fabricated using separate lithography and etch steps. Using a dual damascene process, fabrication of the metal and via levels comprises forming a metal and via level within a deposited inter-level dielectric (ILD) material layer (e.g., silicon oxide, fluorinated silicon oxide, polymers including polyimide and fluorinated polyimide, ceramics, carbon and other dielectric materials). During processing, the ILD layer is deposited and then holes (i.e., via holes) are patterned using known techniques such as the use of a photoresist material which is exposed to define a pattern. After developing, the photoresist acts as a mask through which the pattern of the ILD material is removed by a subtractive etch process (e.g., such as plasma etching or reactive ion etching) to partially form the via holes. A second patterning process proceeds to pattern metal wires within the ILD layer. The pattern is also removed through a subtractive etch process which forms metal trenches and completes via hole etching such that the via holes extend from the top surface of the ILD layer to the bottom surface of the ILD layer, while the metal trenches are comprised within the upper part of the ILD layer. The via holes and metal trenches are then filled in a single metal deposition step to form both a via level and a vertically abutting metal layer (e.g., the metal layer above the via). Metal may be deposited using a filling technique such as electroplating, electroless plating, chemical vapor deposition, physical vapor deposition or a combination of methods. This process may further include planarization of the metal by removing excess material with a method such as chemical mechanical polishing (CMP).

FIG. 1 illustrates a dual damascene structure wherein via level V1 (or V2, or V3) and metal layer M2 (or M3, or M4) are formed by a single metal deposition in the same dielectric layer 112 (or 114, or 116). Dual damascene processing results in a simplified processing flow (e.g., one less deposition step, one less CMP step) and greater reliability (e.g., robust interconnection between metal and via lines within the same dielectric layer) than single damascene processing.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a photolithography mask configured to form a metallization and via level within a single inter-level dielectric layer utilizing a single lithographic process (e.g., exposure) and a single etch step by utilizing an interdependence between the critical dimension of a feature (e.g., metal structure width) and the thickness to which it will form in a deposited ILD layer (e.g., metal structure height). In other words, a metal and via level are formed by a single lithography and etch step by utilizing an interdependence between a features critical dimension and ILD etch rate for that feature.

More particularly, a photolithography mask comprising a mask via shape and one or more mask wire shapes is configured to produce both on-wafer metal wire and via levels. The mask via shape corresponds to an on-wafer photoresist via opening having a first critical dimension (CD). The one or more mask wire shapes correspond to one or more on-wafer photoresist wire openings respectively abutting the on-wafer via opening and respectively having a second critical dimension (CD). The first critical dimension is larger than the second critical dimension thereby providing a greater vertical etch rate for ILD exposed by the photoresist via opening than for ILD exposed by the one or more photoresist wire openings. This difference in critical dimension subsequently results in a via level and one or more metal wire levels, wherein the via level extends vertically below the one or more metal wire levels (e.g., the via region's higher etch rate causes the via to extend through the ILD layer to a metal level below, while the metal wire region's slower etch rate causes the ILD layer to separate the one or more metal wires and the metal level below).

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
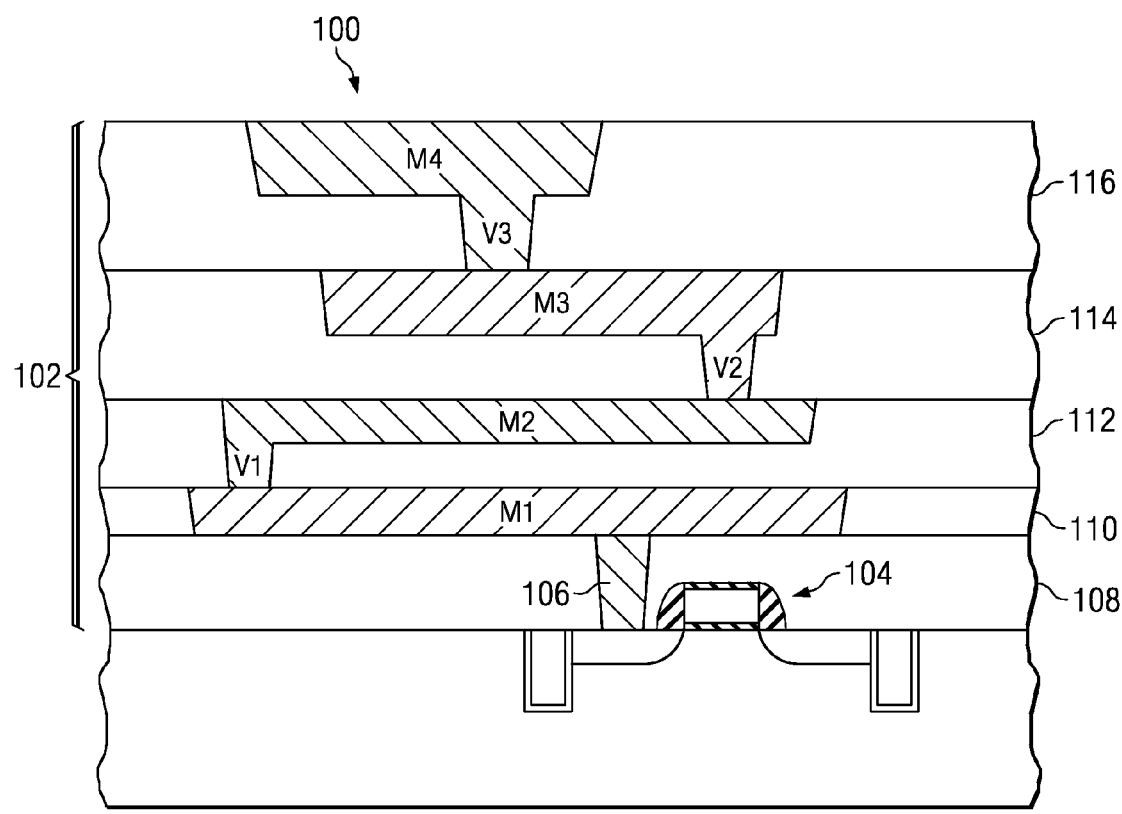
FIG. 1 illustrates an exemplary back end of the line metallization stack comprising alternating metal and via levels.

The present invention will now be described with reference to the attached drawing figures, wherein like reference numerals are used to refer to like elements throughout, and wherein the illustrated structures and devices are not necessarily drawn to scale.

In the examples of this disclosure, the dimensions disclosed for via and metal line width, as well as any other pattern dimensions disclosed herein unless otherwise expressly stated, are based upon the size of the pattern to be formed on the wafer. The actual dimensions for via and metal line width for the photomask patterns will vary depending upon the size of the reduction factor of the photomask. Photomasks are often formed to have, for example, a 4× or 5× reduction factor, meaning that the photomask pattern dimensions can be about 4 or 5 times larger than the corresponding dimensions formed on the wafer. Similarly, the dimensions of the drawn pattern may or may not also have a reduction factor. Therefore, as one of ordinary skill in the art would readily understand, the mask sizes and the drawn pattern sizes can correspond to the wafer dimensions based on any suitable reduction factor, including where the dimensions on the mask and/or drawn pattern dimensions are intended to be the same as those formed on the wafer.

Over the course of its life, the semiconductor industry has relied upon a strategy of scaling down the feature size of integrated chip components to improve speed and functionality of integrated chips. For many years the industry continued to fabricate decreased design sizes through decreasing the wavelength of the illumination source used for lithography. In recent years however, tool vendors have been unable to decrease the wavelength of illumination sources and developing technology nodes now have minimum feature sizes of 20% or less than the wavelength of illumination used in exposure tools. Therefore, successful lithographic exposure of emerging technology thin metal levels relies upon costly resolution enhancement techniques (e.g., immersion lithography, alternating phase shift masks, double patterning/exposure techniques, etc.) that have allowed continued scaling. Such techniques have made the fabrication of modern day integrated chips an extremely complex and expensive process. Therefore, it would be advantageous to be able to form more than one design level using a single photolithography mask.

One embodiment of the present invention relates to a photolithography mask configured to form a metal wire level and a via level within a single inter-level dielectric (ILD) layer using a single level photolithography mask (mask), exposure step, and etch step. More particularly, the present invention relies upon the critical dimension of a feature (e.g., metal structure width) to form a greater etch rate where the via is to be formed compared to the etch rate where the one or more metal wires are to be formed, resulting in the formation of both vias and metal wires using a single processing step (e.g., lithography exposure and etch step). In other words, a metal and via level are formed by a single lithography and etch step by utilizing an interdependence between a features critical dimension and ILD etch rate for that feature's width.

Essentially, a photolithography mask comprising a mask via shape (i.e., via shape on a mask that allows illumination to pass through the mask) and one or more mask wire shapes (i.e., one or more wire shapes on a mask that allow illumination to pass through the mask) is configured to produce both on-wafer metal line and via levels. The mask via shape corresponds to an on-wafer photoresist via opening having a first critical dimension (CD). The one or more mask wire shapes correspond to one or more on-wafer photoresist wire openings respectively abutting the on-wafer via opening and respectively having a second critical dimension. The first critical dimension is sufficiently different (e.g., larger) than the second critical dimension to provide a variation in the vertical etch rate between ILD exposed by the opening of the one or more mask wire shapes and the mask via shape (e.g., to provide a greater vertical etch rate for ILD exposed by the photoresist via opening than for ILD exposed by the one or more photoresist wire openings). This difference in critical dimension subsequently results in a via level and metal level vertically extending to different heights. For example, one embodiment of a mask via shape having a substantially larger critical dimension than the one or more mask wire shapes will result in a via level that extends vertically below the metal wire level (e.g., the via region's higher etch rate causes the via to extend through the ILD to the metal level below, while the metal wire regions slower etch rate causes ILD material to separate the metal wires and the metal level below).

As will be more fully appreciated below, the difference in critical dimension between the mask via shape and the one or more mask wire shapes is predetermined and configured to be sufficiently large such that the difference in vertical depth between the resultant via and metal wire levels is sufficient to prevent inter-level dielectric breakdown between the metal wire level and underlying metal wires. For example, a photolithographic mask provided herein to form a V1 and M2 metal level (e.g., see FIG. 1) is configured to have a difference in critical dimension between the mask via shapes and the mask wire shapes such that M2 is formed to a depth which prevents inter-level dielectric breakdown between M1 and M2. Furthermore, it will be appreciated that the predetermined difference in critical dimension is specifically designed to be greater than critical dimension differences resulting from random process variations. Therefore, the predetermined difference in critical dimension is specifically designed to provide metal wire and via levels within an ILD level taking into consideration inherent critical dimension differences that will arise due to random process variations.

Figure 2:
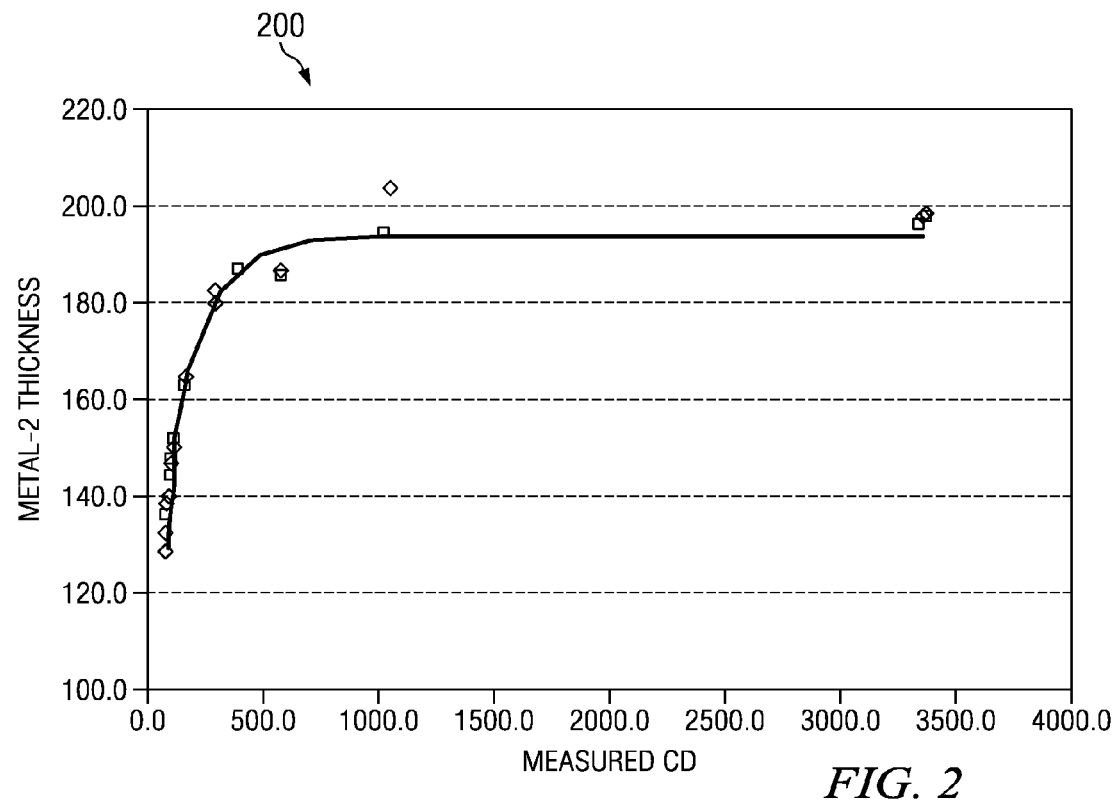
FIG. 2 shows a graph illustrating the relationship between the critical dimension and the on-wafer vertical thickness of a metal structure comprised within an inter-level dielectric (ILD) material.

The present invention relies upon a strong dependence between inter-level dielectric etch rates and critical dimension (e.g., width) of a feature. FIG. 2 shows a graph 200 illustrating the relationship between critical dimension (e.g., width) and on-wafer vertical thickness (i.e., vertical dimension) of a metal structure comprised within a single ILD layer, for an exemplary etch process. More particularly, the graph 200 shows a relationship between the critical dimension and the thickness of various metal structures within an ILD layer subjected to the same etch time. The graph illustrates that, for the exemplary etch process, metal structures having a larger critical dimension will have a larger vertical thickness than metal structures having a substantially smaller critical dimension. In other words, ILD regions associated with metal structures having a larger critical dimension will experience a greater vertical etch rate than ILD regions associated with metal structures having a substantially smaller critical dimension. For example, an ILD layer associated with a metal line having a critical dimension (e.g., width) of 100 nm will etch to a vertical thickness of approximately 120 nm in the same amount of time that an ILD layer associated with a metal line having a critical dimension of 500 nm will etch to a vertical thickness of approximately 190 nm. Therefore, FIG. 2 illustrates that critical dimension can be used as a means for forming metal structures (e.g., metal lines and vias), within an ILD layer, having varying vertical thicknesses by a single lithography and etch process.

It will be appreciated that although the figures of this disclosures will be described in relation to an etch process as illustrated in FIG. 2 (i.e., an etch process in which etch rate increases as critical dimension increases), the present invention is not limited to such etch processes. For example, the inventive concept provided herein may also apply to alternative embodiments comprising an alternative etch process, configured to produce both a metal wire level and a via level, wherein the critical dimension of an on wafer photoresist via opening is substantially different than the critical dimension of the associated on wafer photoresist wire opening.

Figure 3:
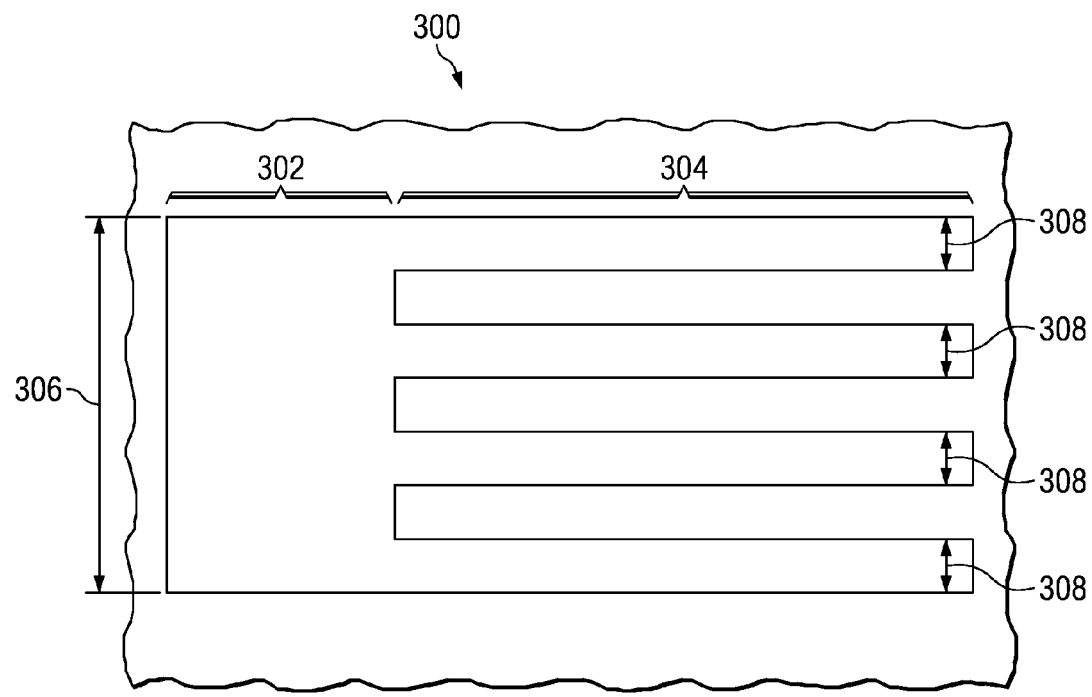
FIG. 3 illustrates a photolithography mask that can be used to form both a metal and via level as provided herein.

FIG. 3 illustrates, in a first embodiment of the present invention, a single photolithography mask 300 configured to produce both a metal wire level and a via level within the same ILD layer using a single lithography processing (e.g., photolithography exposure step) and etch step. The photolithography mask 300 shown in FIG. 3 illustrates the shapes that would be output on the exposed photoresist (e.g., FIG. 3 shows mask shapes as open areas on a chrome on glass mask used with positive photoresist); however, it will be appreciated by one skilled in the art that often the shapes on masks will not be representative of the exposure shapes (e.g., due to optical proximity correct). Therefore, the mask shapes (e.g., 302, 304) illustrated in FIG. 3 are intended only to aid in the understanding of the reader and are not physical representations of an actual mask used in integrated chip production.

Referring again to FIG. 3, the mask 300 comprises a mask via region 302 and a mask wire region 304 comprising one or more mask wire shapes. The mask via region 302 corresponds to an on-wafer photoresist via opening having a first critical dimension (CD) 306 (i.e., the mask via region 302 defines a pattern of a via hole in a photoresist having a first critical dimension). The mask wire region 304 comprising one or more mask wire shapes corresponds to a one or more on-wafer photoresist wire openings respectively abutting the on-wafer via region and having a second critical dimension 308 (i.e., the metal wire region 304 defines a pattern of one or more metal lines in a photoresist having a second critical dimension). The first critical dimension 306 is substantially larger than the second critical dimension 308 by an amount that provides a significantly greater vertical etch rate (e.g., according to the graph of FIG. 2) into a single ILD layer at the photoresist via opening than at the one or more photoresist wire openings. In other words, the mask of FIG. 3 provides a means for forming a faster ILD etch rate where via openings are to be formed compared to where metal trenches are to be formed resulting in a deeper ILD etch for vias and a shallower ILD etch for metal wires. This difference in etch depth forms a sufficiently deep etch for vias to contact a conductive level below, while forming a sufficiently shallow depth for abutting metal wire to not electrically contact a conductive layer below.

Figure 4:
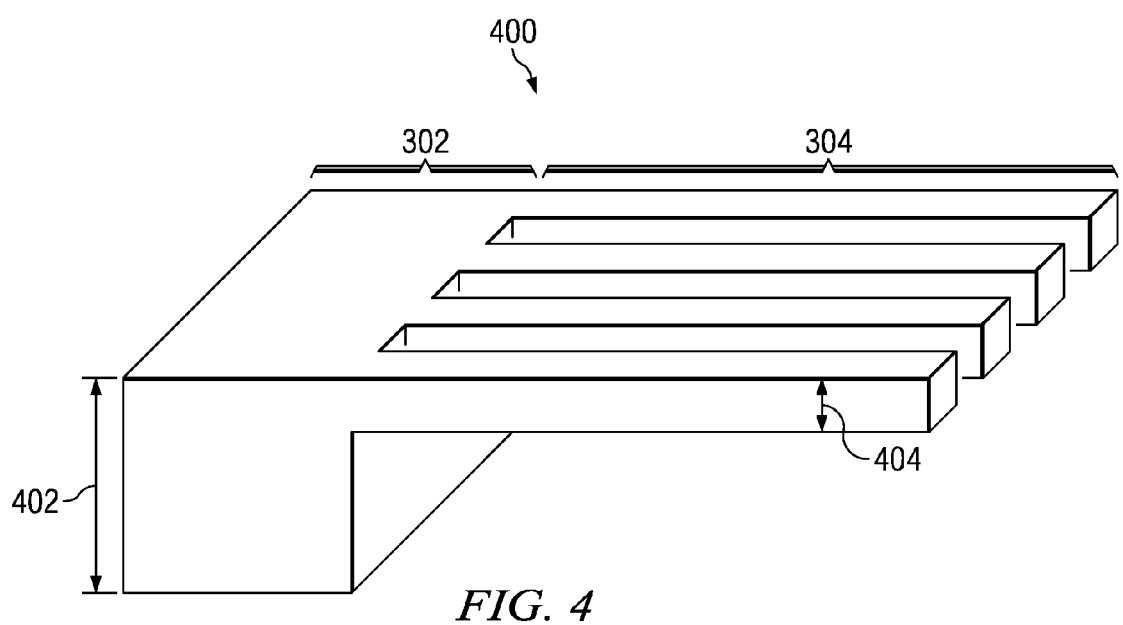
FIG. 4 illustrates an on-wafer illustration of a metal and via level produced by the photolithography mask of FIG. 3.

FIG. 4 illustrates a resultant metal and via structure 400 within a single ILD layer. As illustrated in FIG. 4, the on-wafer metal shape formed by the mask via region 302 is a via extending to a vertical distance of 402, while the on-wafer metal shape formed by the mask wire region 304 comprising one or more mask wire shapes is one or more metal wires extending to a vertical distance of 404, wherein vertical distance 402 is larger than vertical distance 404 (e.g., V1 is formed to a vertical distance below M2 in the same dielectric layer 112). The difference between the on-wafer via level and the on-wafer metal wire level heights (402 and 404) allows the on-wafer via to form an electrical connection between the metal level and lower metal levels in the BEOL stack, while keeping the on-wafer metal wires electrically isolated from the lower metal levels. As shown in FIGS. 3 and 4, multiple metal wire shapes with widths of critical dimension 308 may be formed in parallel, laterally spaced positions to provide a composite wire run with the height 404 and an effective total width (e.g., width of abutting via critical dimension 306) greater than the critical dimension 308, such as to provide a composite conductive run extending from one via to another (e.g., to provide a conductive wire run in metal layer M2 extending between via V1 in layer 112 and via V2 in layer 114, as shown in FIG. 1).

Therefore, as illustrated in FIGS. 3 and 4, the photolithography mask 300 comprises a mask via region 302 with a critical dimension that has been selectively chosen to be greater than the critical dimension of the mask wire region 304, so that the vertical dimension of an on-wafer via 402 is larger than the vertical dimension of the abutting on-wafer metal wires 404 (i.e., on-wafer via regions are formed to a greater thickness than on-wafer metal wire regions). In other words, vertical variation between metal structures (e.g., vias and metal wires) is formed by selective critical dimension variation resulting in via and metal wire structures.

Figure 5:
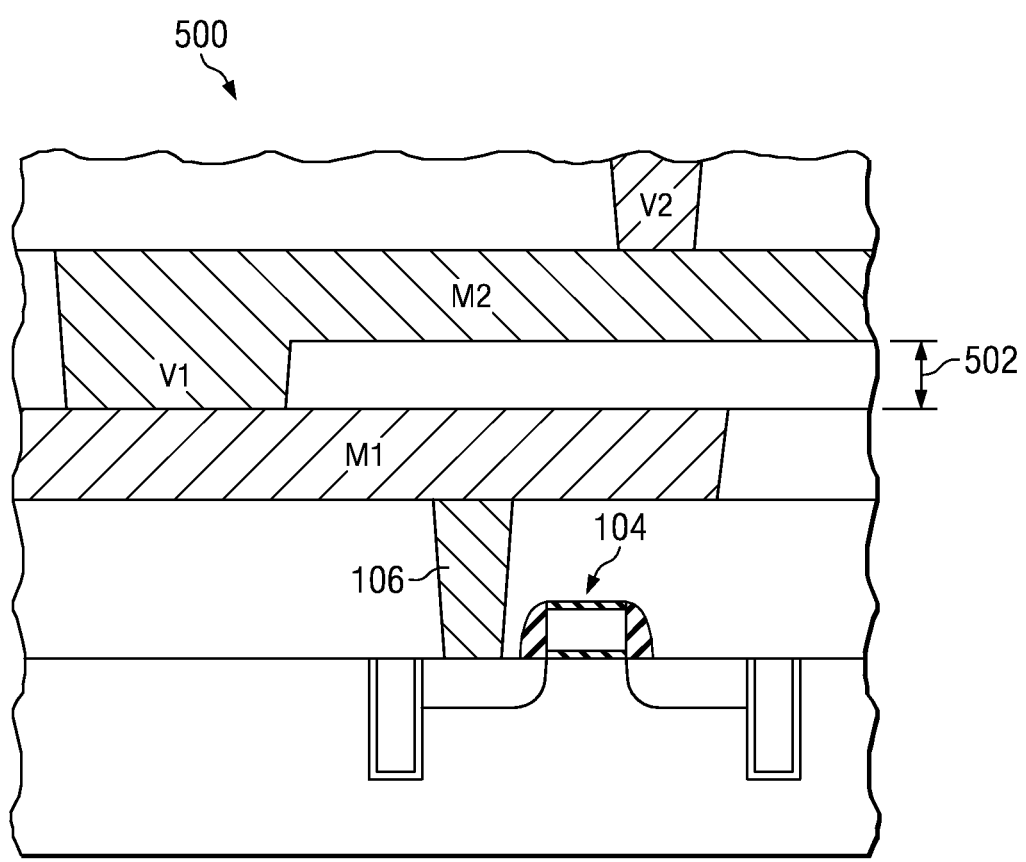
FIG. 5 illustrates a back end of the line stack according to the present invention.

FIG. 5 illustrates a back end of the line metallization stack according to the present invention. The photolithography mask (e.g., 300) provided herein will have a sufficient difference in critical dimension between the mask via shape of the mask via region (e.g., 302) and the one or more mask wire shapes of the abutting mask wire region (e.g., 304) such that an ILD thickness between the resultant on-wafer metal wire level and a conductive layer below (e.g., between the bottom of metal wire M2 and the top of metal wire M1) is sufficient to avoid inter-level dielectric breakdown (e.g., inter-level electrical shorting). For example, in FIG. 5, if V1 and M2 are formed according to a photolithography mask provided herein, a resulting vertical distance of 502 is sufficiently large to avoid inter-level dielectric breakdown between the bottom of M2 and the top of M1. It will be appreciated by one skilled in the art that this distance 502 varies according to a number of properties including the dielectric constant of the ILD material and the operating voltages of the metal wires. For example, dielectric materials with a lower dielectric constant will need a smaller distance between metal wires. Similarly, metal wires operating at smaller voltages will need smaller distance between metal wires.

Figure 6A:
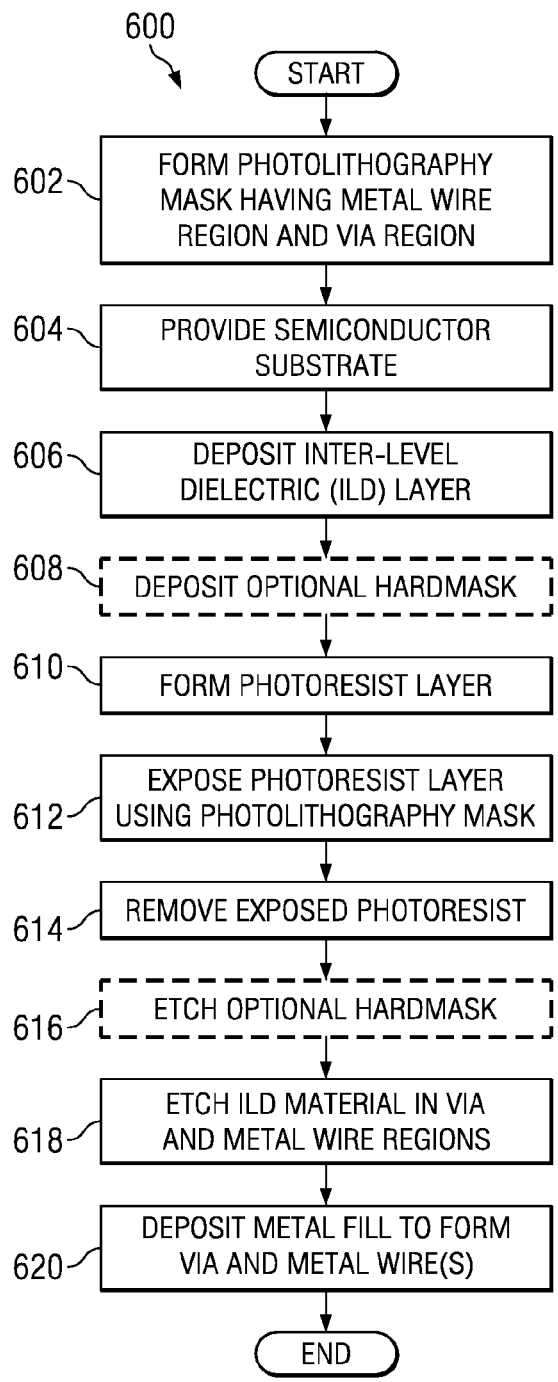
FIG. 6A illustrates a method for producing a metal and via level within an ILD material using a single photolithography mask and process.

FIG. 6A illustrates a method for forming a via level and a metal level for a dual damascene process using a single lithography and a single etch process. The method of FIG. 6A relies upon the strong dependence between inter-level dielectric etch rates and critical dimension (e.g., width) of a feature (e.g., as shown in FIG. 2).

While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 6B:
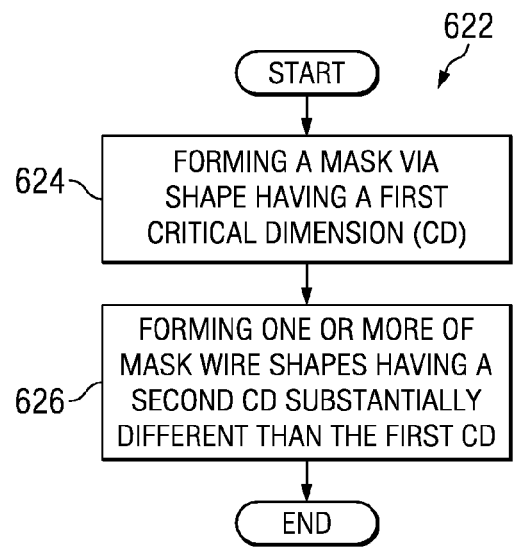
FIG. 6B illustrates a method for producing a photolithography mask for the formation of metal and via level processing step.

At 602 a photolithography mask is formed having both mask wire shapes and mask via shapes. More particularly, the mask comprises a mask via region and a mask wire region, wherein the mask via region is selectively chosen to define a pattern of a via hole in a photoresist having a first critical dimension, and wherein the mask wire region is selectively chosen to define a pattern of a metal wire trench in a photoresist having a second critical dimension substantially smaller than the first critical dimension (e.g., see FIG. 3). In one embodiment, the photolithography mask may comprise an alternating phase shift mask. In alternative embodiments, the photolithography mask may comprise an embedded attenuated phase-shift mask, or an attenuating phase shift mask. In an additional embodiment, the photolithography mask may comprise any of the above masks utilized in a double patterning (i.e., double patterning/exposure) mask set, in which two lithographic masks are used for exposure of a single design level. In one embodiment the photolithography mask is formed by the method illustrated in FIG. 6B, wherein a mask via shape having a first critical dimension (624) is formed on a photolithography mask and then one or more mask wire shapes are formed on the photolithography mask having a second critical dimension substantially different (e.g., substantially smaller) than the first critical dimension (626).

A semiconductor substrate is provided at 604. The substrate may comprise any type of semiconductor body (e.g., silicon, SiGe, SOI) such as a semiconductor wafer or one or more die on a wafer, as well as any other type of semiconductor and/or epitaxial layers formed thereon and/or otherwise associated therewith. The semiconductor substrate will comprise at least one conductive layer (e.g., a first metallization level connected to semiconductor devices).

Figure 7:
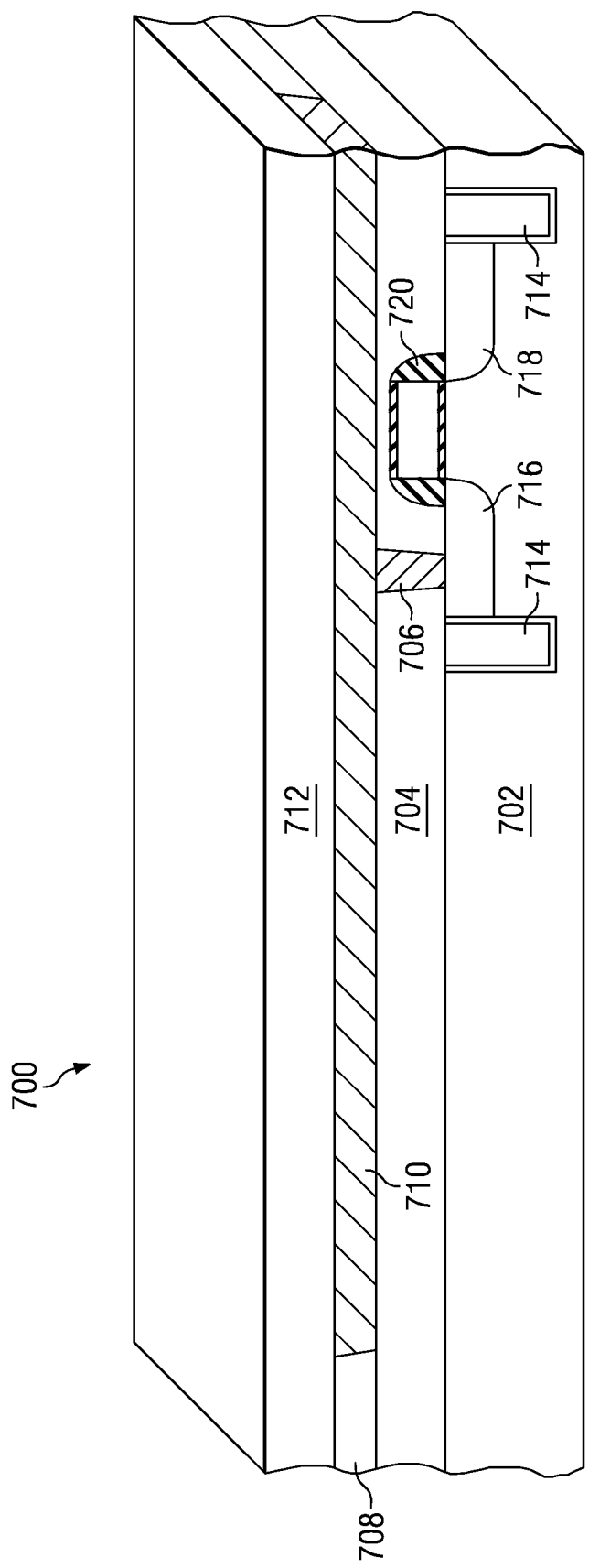
FIGS. 7-12 illustrate cross sectional views of the method of FIG. 6A.

At 606 an ILD layer material layer is formed on the semiconductor substrate. In general, ILD layers having low dielectric constants are used for thin metal layers. In one embodiment an ultra-low dielectric material is deposited onto the semiconductor substrate. In an alternative embodiment silicon oxycarbide (SiCO) is deposited as an ILD layer onto the semiconductor substrate. FIG. 7 illustrates a cross sectional view of a semiconductor substrate 702 having an ILD layer 712 formed on the semiconductor substrate 702. As shown in FIG. 7, the ILD layer 712 is formed above a conductive metal layer 710, wherein the metal layer 710 is formed from by a single damascene process (illustrated by the formation of ILD layer 704 for contact 706 and ILD layer 708 for metal layer 710).

At 608 a hard mask is optionally deposited onto the ILD layer. The hard mask 1002 may be, for example, around 50 to 500 nm thick and, for example, comprises TiAlN, TiN, Ti, $TiO_2$, Al, AlOx, AlN, TiAl, TiAlOx, Ta, TaOx, TaN, Cr, CrN, CrOx, Zr, ZrOx, ZrN, Hf, HfN, HfOx, silicon-rich nitride (SRN), silicon-rich oxynitride (SRON), silicon oxide, low-k dielectric, or any stack or combination thereof. An example of a hard mask stack is 300 nm of PECVD deposited $SiO_2$ on 50 nm of sputter deposited TiAlN or TiN.

The deposition of the hard mask 1002 may comprise a single or multi-layer stack of different materials in order to better control the hard mask profile and remaining hard mask thickness. For example, a hard mask stack is 30 nm of TiAlN on 120 nm of TiAl, which is formed on 20 nm TiAlO which is formed on 50 nm of TiAlN. All of these layers are, for example, deposited by sputter deposition in the same chamber where the film composition is changed during the deposition by varying the gas composition ($Ar+N_2$ (50/50) for nitride, Ar for metal, and $Ar+O_2$ (90/10) or $Ar+N_2+O_2$ (85/10/5) for oxide). The TiAlN is, for example, deposited at around 400 C with high power to achieve roughly 100 nm/min TiAlN deposition rate. The TiAlN can be replaced by TiN for all of these cases.

Figure 8:
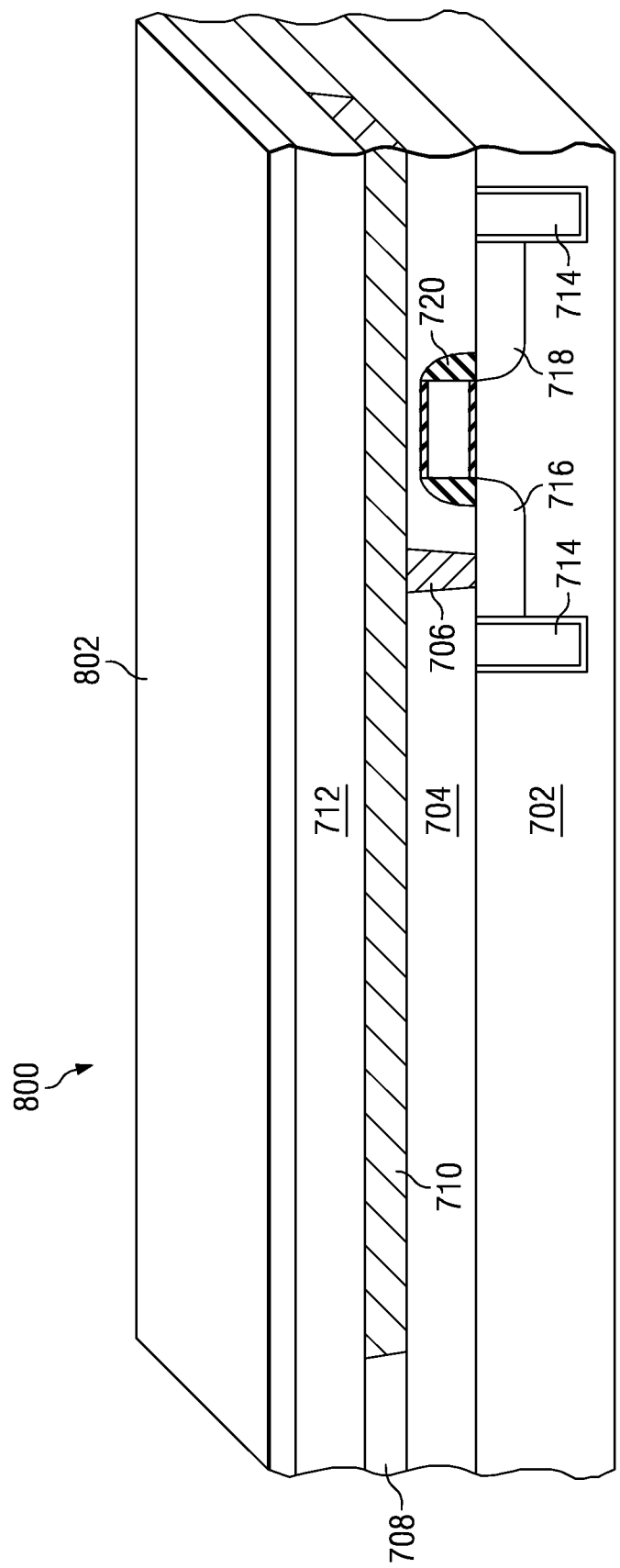

At 610 a photoresist layer is formed on the semiconductor substrate above the ILD layer. Photoresist is an illumination sensitive film used to pattern substrates by blocking the substrate from exposure to implant, etch, etc. Photoresist comes in two tones, positive and negative. Positive photoresist will be structurally weakened when it is exposed and negative photoresist will be structurally strengthened when it is exposed. Substrates are completely covered with photoresist and after exposure the structurally weaker area of the photoresist is removed from the substrate through etching leaving the more robust area on the substrate. FIG. 8 illustrates a cross sectional view of a semiconductor substrate 702 with a photoresist layer 802 formed above ILD layer 712.

Figure 9:
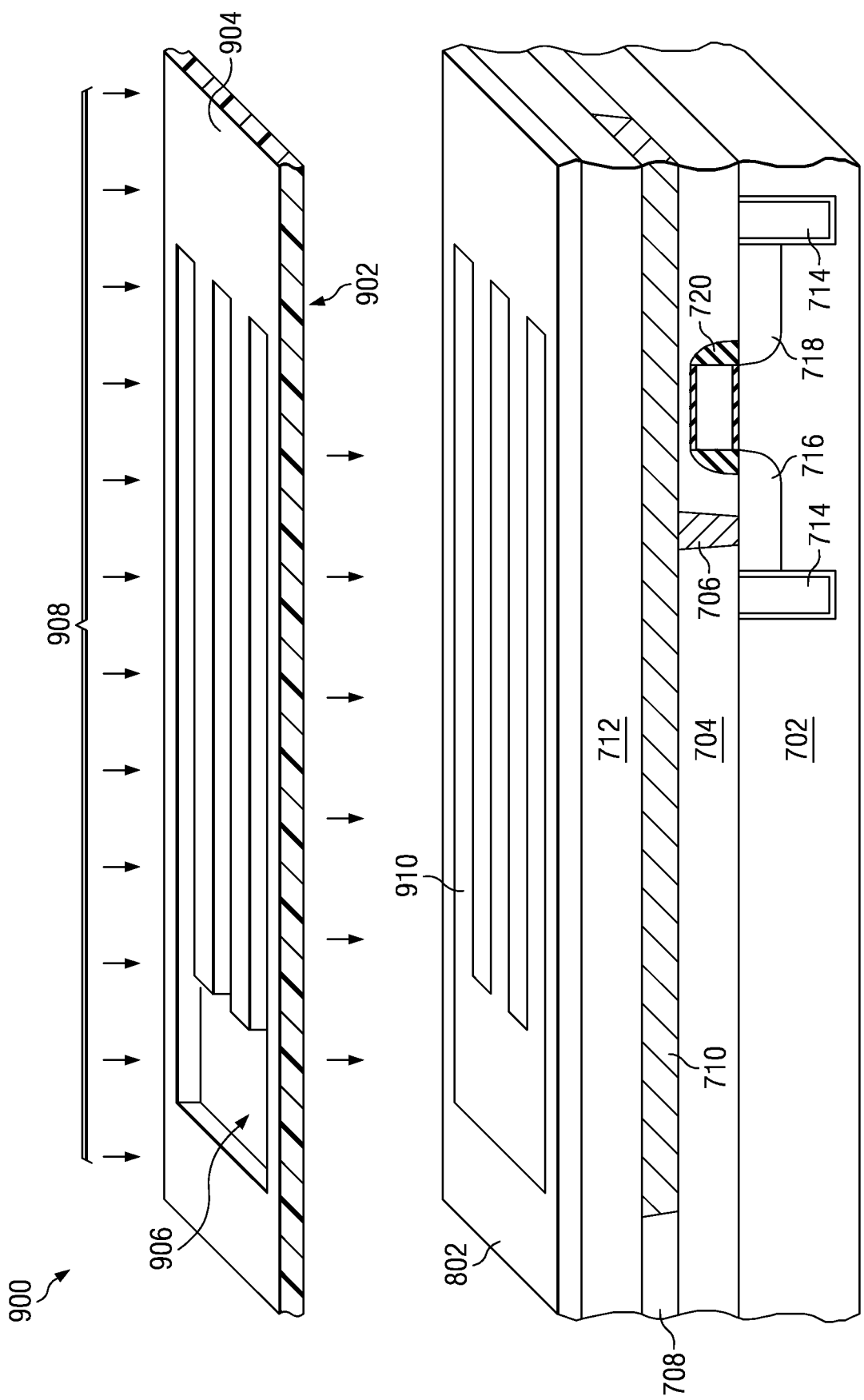
Figure 10:
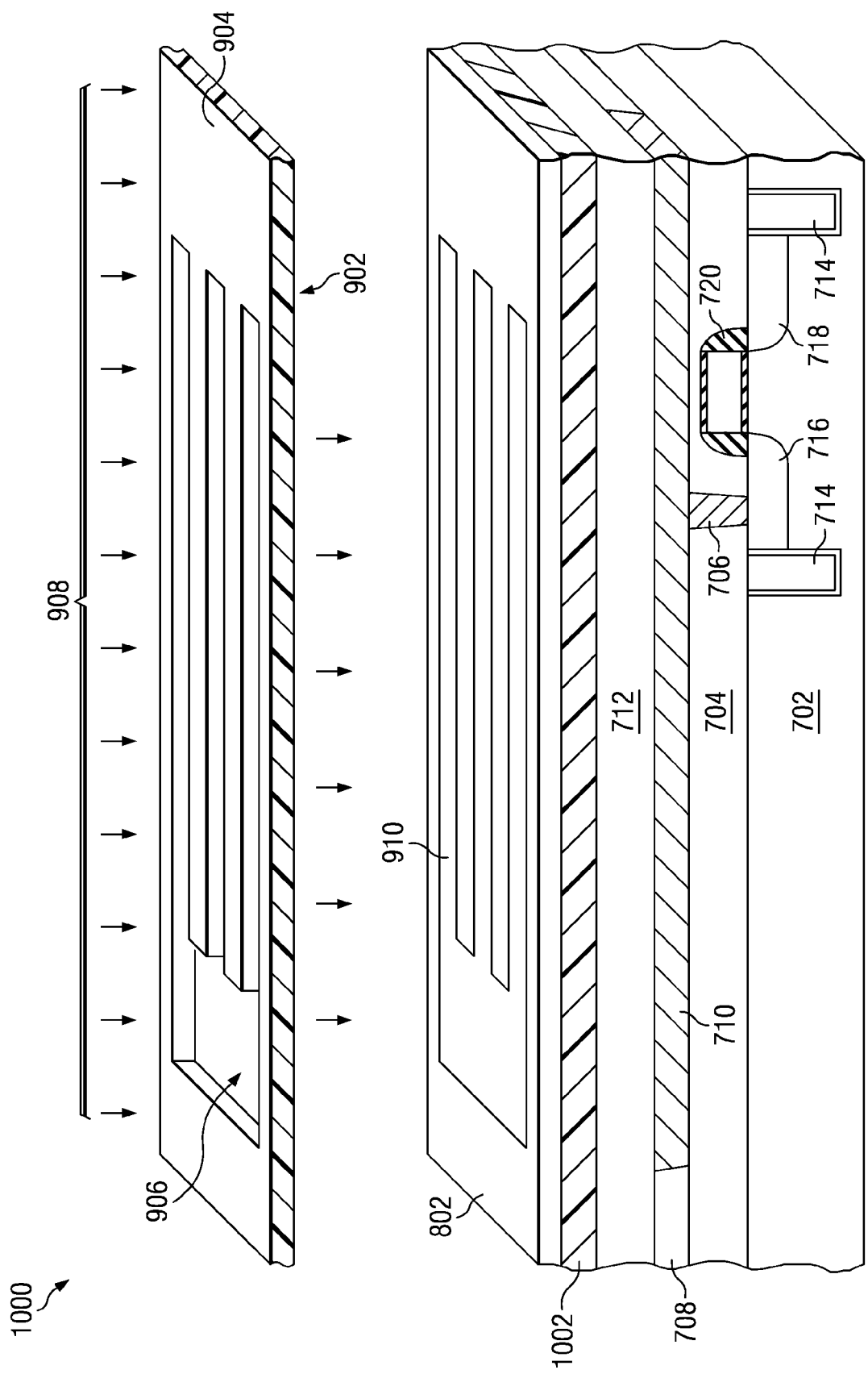

A lithographic process is performed using the photolithography mask provided herein at 612 and 614. The lithographic process comprises exposure of the photoresist layer (612) and removal (i.e., development) of the exposed photoresist layer (614). More particularly, an illumination source selectively exposes the photoresist 802 through a mask 902 placed between the illumination source 908 and the photoresist 802. The photoresist 802 is then developed resulting in the removal of exposed photoresist 910. This forms openings in the photoresist for both via holes and metal wire lines above the ILD layer (e.g., exposes the ILD layer at the location of the on-wafer vias and the on-wafer metal wires). FIGS. 9 and 10 illustrate an example of a lithographic process with and without the optional hard mask. FIGS. 9 and 10 utilize an exemplary chrome on glass mask 902 to expose a photoresist layer 802, wherein illumination passes through a mask opening 906, but not through the chrome 904. In alternative embodiments, the photolithography mask may comprise alternative mask types (e.g., embedded attenuated phase-shift mask, attenuating phase shift mask) and/or optical proximity correct shapes.

The optional hard mask is etched away at 616. The etchant used for hard mask 1002 etching may vary depending on the material used for the hard mask 1002. Reactive ion etching is often used for hard mask 1002 etching. For example, a titanium aluminum nitride (TiAlN) hard mask 1002 may be effectively etched using plasma made from a mixture of Cl$_2$ and BCl$_3$ in a cold substrate process or any other suitable etch process for etching TiAlN The ILD level is etched away at 618. In one embodiment, shown in FIG. 11, ILD layer 712 is etched away in areas not covered by photoresist 802, thereby forming both via holes 1102 and metal trenches 1104 in the ILD layer 712 with a single processing etch step. The ILD layer 712 is etched away using a plasma etchant. The photoresist 802 may be stripped using a plasma system or using an aqueous cleaning solution. For plasma systems, inert gases such as Argon or Oxygen may be used to form the plasma for stripping. If an aqueous cleaning solution is used, the solution may be a chemical mixture comprising the principal ingredients Choline and Monoethanolamine (MEA), for example. In an alternative embodiment a hard mask 1002 is used to selectively etch away the ILD layer 712 with a single processing etch step. If a hard mask is used the hard mask is selectively etched in areas where there is no photoresist and then the ILD level is etched away in areas where there is no hard mask.

Figure 11:
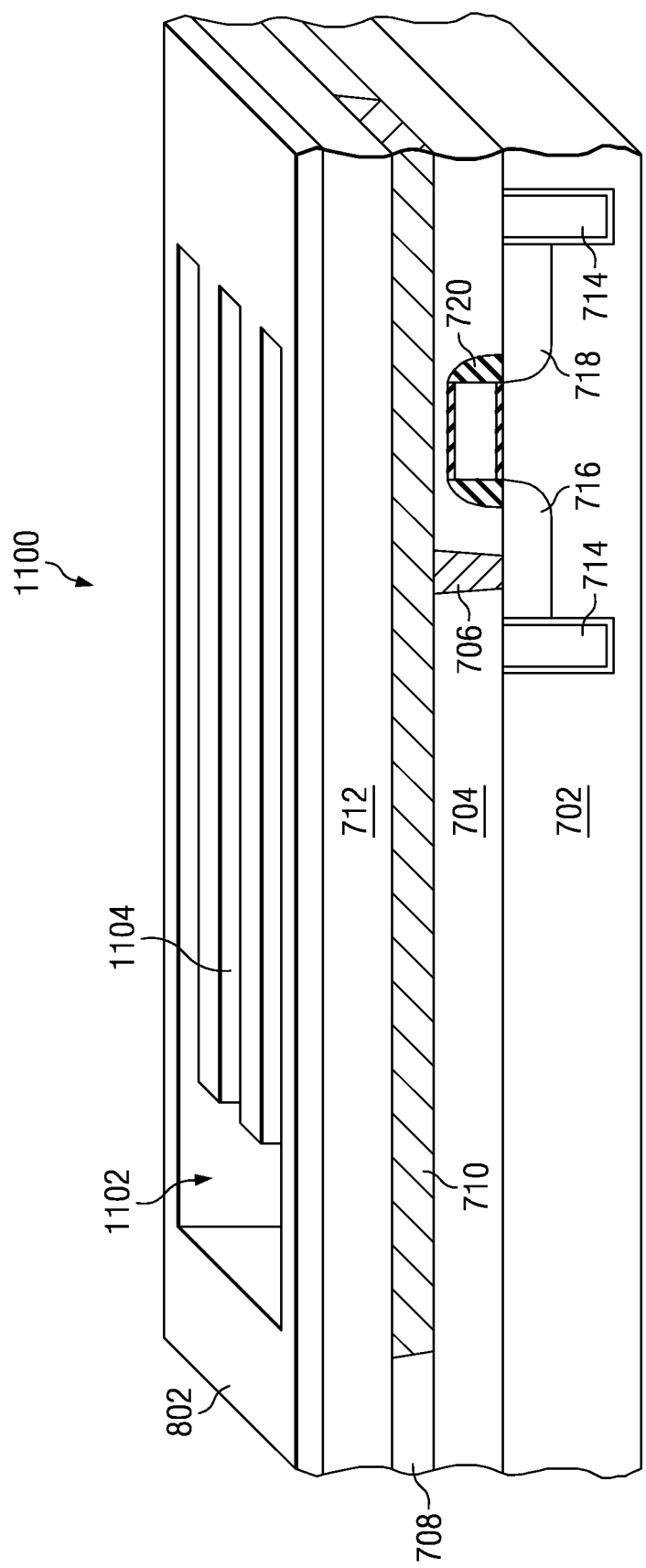
Figure 12:
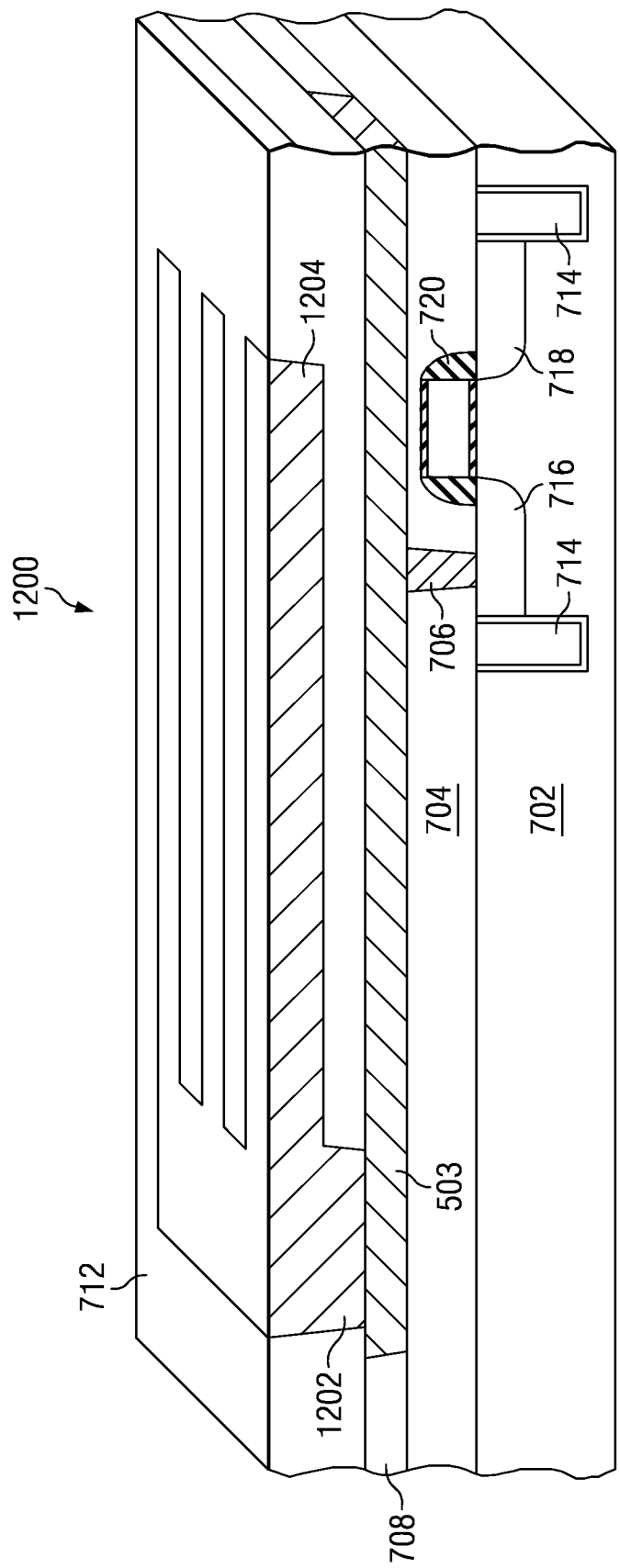

Metal is deposited at 620. Metal is deposited into both the ILD via holes 1102 and metal trenches 1104 resulting in a via level 1202 and a metal level 1204 as shown in FIG. 12. It will be appreciated that the via level 1202 and metal wire level 1204, as shown in FIG. 12, comprise a barrier layer that is not shown. Metal deposition can refer to the deposition of a copper metal or of any lower conductivity metallic material that can be deposited into holes and trenches. In one embodiment, a metal deposition is performed using chemical vapor deposition (CVD). In such an embodiment, a barrier layer (i.e., trench liner) is deposited onto the bottom and sides of the via holes and metal trenches prior to metal deposition. The barrier layer avoids metal diffusion between the deposited metal 1204 and ILD 712. The barrier layer also improves adhesion of the copper metal level (e.g., 1204) and vias (e.g., 1202) to inter-level dielectric layers (e.g., ILD 712) or other metallization (e.g., metal layer 710). The barrier layer is typically a refractory metal such as tantalum (Ta) or tantalum nitride (TaN). In one embodiment, physical vapor deposition is used for barrier metal deposition. Deposition of the primary metal layer (e.g., copper) then follows. In an alternative embodiment, metal deposition is performed using electrochemical deposition (ECD) or electroplating. Once the metal is deposited, chemical mechanical polishing (CMP) may be performed to planarize the surface of the substrate. FIG. 12 illustrates a cross-sectional view of a semiconductor substrate with metal deposited. As shown in FIGS. 11 and 12, the photoresist layer 802 (FIG. 10) may be formed to define a pattern including a plurality of metal line trenches extending longitudinally from the via hole in adjacent parallel, laterally spaced positions. In the illustrated embodiment, the sum of the widths and spacings of the metal line trenches is about equal to the width of the via hole.

In one particular embodiment, the photolithography mask shown in FIG. 3 is configured to form a first via level (e.g., FIG. 1, V1) and a second metal level (e.g., FIG. 1, M2) on a thin metal level of a 45 nm design node. In such an embodiment the one or more metal wires and the via are formed in an ILD layer (e.g., a combination of silicon carbide (SiCO) as a via-etch stop layer and a layer of low dielectric constant) having a post CMP thickness of 180 nm. The one or more metal wires are configured to respectively have a critical dimension (e.g., width) of 80 nm and the via is configured to have a critical dimension (e.g., width) of 560 nm. After etch and metal deposition, the resulting thickness of the one or more metal wires is 130 nm thick and the resulting thickness of the via is 180 nm thick. Therefore the via extends from the top of the ILD layer to metal layer below while the metal wires extend from the top of the ILD layer to a distance of 50 nm above the metal layer below. Accordingly, the resultant structure provides an inter metal level via connection and metal wires with a single photolithography exposure.

Among its advantages, the present invention provides significant cost savings in processing over prior art methods of forming a via and subsequent metal level. For example, the number of photolithography masks utilized for the formation of a via and metal level is reduced. This cost savings is significant at thin metal levels where highly complicated photolithography masks are extremely expensive. Therefore, in one particular embodiment of the present invention the photolithography mask provided herein is a thin metal level mask. Also, the elimination of processing steps reduces fabrication costs. For example, only one photolithography, one etch, and one surface preparation step are needed for the formation of both the metal and via level as opposed to prior art methods which require separate photolithography, etch, and surface preparation steps for the formation of each of the metal and via level (i.e., two photolithography, two etch, and two surface preparation steps are needed for the formation of both the metal and via level).

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for forming a metal level and a via level within a single inter-level dielectric layer, comprising:

providing a semiconductor substrate comprising a conductive layer positioned on the substrate;

forming an inter-level dielectric layer of a dual damascene structure on the semiconductor substrate;

performing a lithography process that forms a photoresist layer above the inter-level dielectric to define a pattern of a via hole having a width of a first critical dimension and a plurality of metal line trenches with widths of a second critical dimension abutting the via hole, wherein the first critical dimension is larger than the second critical dimension, and wherein the metal line trenches extend in parallel, laterally spaced positions from the via hole; and performing a first etching process according to the pattern of the photoresist layer to remove the inter-level dielectric layer not covered by the pattern of the photoresist layer, the removal proceeding at different vertical etch rates for the via hole and the plurality of metal line trenches determined by differences in the first and second critical dimensions, so as to form the via hole by etching vertically at a first etch rate from a top of the inter-level dielectric layer down to the conductive layer and to simultaneously form the plurality of metal line trenches by etching vertically at a second etch rate from the top of the inter-level dielectric layer down to a depth only within an upper part of the inter-level dielectric layer.

2. The method of claim 1, further comprising simultaneously depositing a metal into the via hole and into the plurality of metal line trenches.

3. The method of claim 2, wherein the metal comprises copper.

4. The method of claim 2, wherein an inter-layer dielectric layer thickness between the conductive layer and the metal deposited into the plurality of metal line trenches is sufficient to prevent inter-level dielectric breakdown.

5. The method of claim 1, wherein the first etching process is performed using a plasma etching.

6. The method of claim 1, further comprising:
depositing a hard mask onto the inter-level dielectric layer prior to performing the lithography process; and
performing a second etching process according to the pattern of the photoresist layer to remove the hard mask not covered by the pattern of the photoresist layer.

7. The method of claim 6, wherein the hard mask comprises TiAlN, TiN, Ti, $TiO_2$, Al, AlOx, AN, TiAl, TiAlOx, Ta, TaOx, TaN, Cr, CrN, CrOx, Zr, ZrOx, ZrN, Hf, HfN, HfOx, silicon-rich nitride (SRN), silicon-rich oxynitride (SRON), silicon oxide, low-k dielectric, or any stack or combination thereof.

8. The method of claim 1, wherein a sum of the widths and spacings of the metal line trenches in the plurality of metal line trenches is equal to about the width of the via hole.

9. A method for fabricating an integrated circuit including metal and via levels formed within a layer of inter-level dielectric material, the method comprising:
forming an inter-level dielectric layer over a substrate;
forming a mask over the inter-level dielectric layer;
patterning the mask to provide a mask via region defining a via opening having a first critical dimension and a mask wire region defining a plurality of trench openings with widths of a second critical dimension, the second critical dimension being less than the first critical dimension, and the plurality of trench openings extending in parallel, laterally spaced positions from the via opening defined by the mask via region;
simultaneously etching the inter-level dielectric layer at a first vertical etch rate from a top of the inter-level dielectric layer all the way through the mask via region and at a second vertical etch rate from the top of the inter-level dielectric layer only through the mask wire region, the first and second vertical etch rates being determined by the respective sizes of the first and second critical dimensions, so that the via opening is formed through the inter-level dielectric layer by etching at the first vertical etch rate at the same time as the plurality of trench openings are formed only partway into the inter-level dielectric layer by etching at the second vertical etch rate; and
filling the via opening and the one or more trench openings with conductive material.

10. The method of claim 9, wherein filling the via opening and the one or more trench openings comprises simultaneously filling the via opening and the plurality of trench openings.

* * * * *